(12) United States Patent
Lee

(10) Patent No.: US 7,932,538 B2
(45) Date of Patent: Apr. 26, 2011

(54) INSULATED GATE BIPOLAR TRANSISTOR AND METHOD OF FABRICATING THE SAME

(75) Inventor: Sang-Yong Lee, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 208 days.

(21) Appl. No.: 12/344,446

(22) Filed: Dec. 26, 2008

(65) Prior Publication Data
US 2009/0206364 A1 Aug. 20, 2009

(30) Foreign Application Priority Data
Dec. 27, 2007 (KR) .................. 10-2007-0138547

(51) Int. Cl.
*H01L 29/739* (2006.01)
*H01L 21/331* (2006.01)

(52) U.S. Cl. ......... 257/139; 257/E29.199; 257/E29.197; 257/E21.382; 257/E21.383; 438/135; 438/138

(58) Field of Classification Search .................. 257/139, 257/E29.197, E29.199, E21.382, E21.383; 438/135, 138
See application file for complete search history.

(56) References Cited

U.S. PATENT DOCUMENTS
2009/0057710 A1* 3/2009 Lee ............................... 257/139
* cited by examiner

*Primary Examiner* — Victor Mandala
*Assistant Examiner* — Whitney Moore
(74) *Attorney, Agent, or Firm* — Sherr & Vaughn, PLLC

(57) ABSTRACT

According to embodiments, an insulated gate bipolar transistor (IGBT) may include a first conductive type collector ion implantation area, formed within a substrate, second conductive type first buffer layers, formed over the collector ion implantation area and each including a first segment buffer layer and a second segment buffer layer, a first conductive type poly layer formed from a surface of the substrate to the collector ion implantation area, the first conductive type poly layer having a contact structure, a second buffer layer of the second conductive type, formed in the substrate area next to the first conductive type poly layer. According to embodiments, a segment buffer layer may have different concentrations according areas. Accordingly, amounts of hole currents injected through the buffer layers may differ according to areas.

Figure 1:
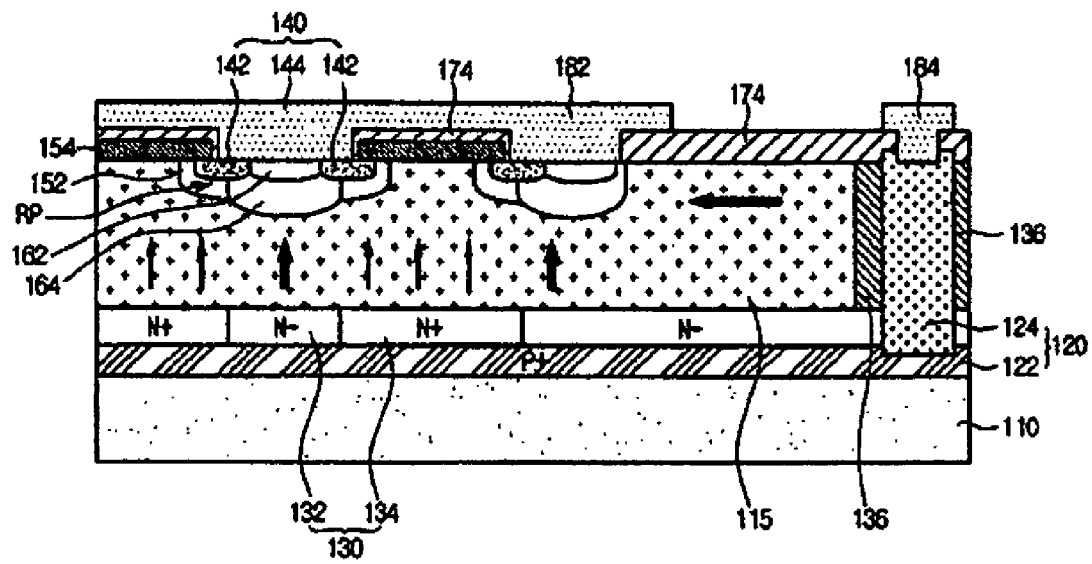
Figure 2:
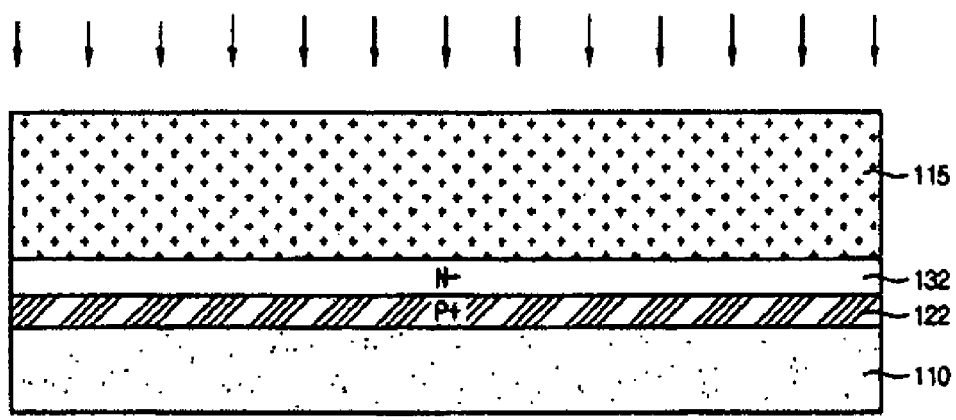

9 Claims, 4 Drawing Sheets

INSULATED GATE BIPOLAR TRANSISTOR AND METHOD OF FABRICATING THE SAME

The present application claims priority under 35 U.S.C. 119 to Korean Patent Application No. 10-2007-0138547 (filed on Dec. 27, 2007), which is hereby incorporated by reference in its entirety.

BACKGROUND

An Insulated Gate Bipolar Transistor (IGBT) may be an element that may incorporate an insulated gate structure of a MOS transistor and a high current density characteristic of a bipolar transistor. A IGBT may have a parasitic PNPN thyristor structure including an N type drift area, a P+ collector area, a P type base, and a N+ emitter N on and/or over a channel under a gate, unlike a MOS transistor. When a current gain sum of a NPN transistor and a PNP transistor is 1 or more, the PNPN thyristor may be turned on. This may cause a latch-up phenomenon, in which the gate may lose its ability to turn off. This latch-up phenomenon may limit a safe operating area (SOA) of an IGBT, and may damage elements since an abruptly excessive current may flow through the elements.

SUMMARY

Embodiments relate to an insulated gate bipolar transistor (IGBT) and a method of fabricating the same. Embodiments relate to an IGBT and a method of fabricating the same, which may minimize a forward voltage drop and may prevent parasitic thyristor latch-up.

According to embodiments, an IGBT may include at least one of the following. A collector ion implantation area of a first conductive type, formed within a substrate. First buffer layers of a second conductive type, formed on and/or over the collector ion implantation area and each including a first segment buffer layer and a second segment buffer layer. A first conductive type poly layer formed from a surface of the substrate to the collector ion implantation area, where the first conductive type poly layer may have a contact structure. A second buffer layer of the second conductive type, formed in a substrate area next to the first conductive type poly layer. Base areas of the first conductive type, formed in the substrate on and/or over the first buffer layers. Gates formed on and/or over the substrate on one side of the base areas. Emitter ion implantation areas of the second conductive type, formed within the base areas.

According to embodiments, a method of fabricating an IGBT may include at least one of the following. Forming a collector ion implantation area within a substrate by implanting ions of a first conductive type. Forming first buffer layers, each including a first segment buffer layer and a second segment buffer layer, on and/or over the collector ion implantation area by implanting ions of a second conductive type. Forming base areas in the substrate on and/or over the first buffer layer by implanting ions of the first conductive type. Forming a trench from the substrate to the collector ion implantation area. Forming a second buffer layer of the second conductive type in the substrate area next to the trench by performing an ion implantation process. Gap-filling the trench with ion-implanted polysilicon, to form a poly layer of the first conductive type. Forming emitter ion implantation areas within the base areas, respectively, by implanting ions of the second conductive type.

DRAWINGS

Example FIG. 1 is a sectional view of an IGBT, according to embodiments.

Example FIGS. 2-8 are sectional views illustrating a method of fabricating an IGBT, according to embodiments.

DESCRIPTION

An insulated gate bipolar transistor (IGBT) and a method of fabricating an IGBT according to embodiments will be described with reference to the accompanying drawings. According to embodiments, a first conductive type may be a P type and a second conductive type may be an N type. According to embodiments, a first conductive type may be an N type and a second conductive type may be a P type.

Example FIG. 1 is a sectional view of an IGBT, according to embodiments. Referring to example FIG. 1, according to embodiments, an IGBT may include collector ion implantation area 122 of a first conductive type, formed within substrate 110. An IGBT may include first buffer layer 130 of a second conductive type, which may be formed on and/or over collector ion implantation area 122, and may include first segment buffer layers 132 and second segment buffer layers 134. An IGBT may include base areas 152 of the first conductive type, formed in substrate 110 on and/or over first buffer layer 130. Gates 154 may be formed on and/or over substrate 110 on a side of base areas 152, and emitter ion implantation areas 142 of the second conductive type may each be formed within base areas 152. Insulating layers 174 may be formed and may surround gates 154. Emitter electrode 144 may be provided and may be electrically connected to emitter ion implantation areas 142. Poly layer 124, of the first conductive type, may be electrically connected to collector ion implantation area 122. Second buffer layer 136 of the second conductive type may be formed in substrate 110 adjacent to first conductive type poly layer 124. Collector electrode 184 may be connected to first conductive type poly layer 124.

According to embodiments, driving an IGBT may be performed by supplying current to drift area 115 of the second conductive type through a channel under gates 154, in a PNP transistor structure which may include first conductive type base area 152, drift area 115, and first conductive type collector ion implantation area 122. An IGBT may be driven more easily than a bipolar element with respect to power, since it may be driven as a MOS gate. According to embodiments, an IGBT may have a small voltage drop at drift area 115 because minority carriers injected from the collector may generate conductivity modulation in drift area 115. Accordingly, an IGBT may minimize power consumption. First ion implantation areas 162 of the first conductive type may be formed on and/or over one sides of emitter ion implantation areas 142 within base area 152. According to embodiments, this may reduce electrical resistance with emitter electrode 144.

Second ion implantation areas 164 of the first conductive type may be formed below and/or under first ion implantation areas 162. Since second ion implantation area 164 of a high-concentration first conductive type may be formed under base area 152, an amount of resistance Rp at bottoms of base areas 152 may be reduced. This may increase a level of current, generating latch-up. First buffer layer 130 may include first segment buffer layers 132 formed at locations vertically corresponding to second ion implantation areas 164, respectively. Second segment buffer layers 134 may be formed next to first segment buffer layers 132. According to embodiments, first segment buffer layer 132 may have a concentration lower than that of second segment buffer layer 134.

First buffer layer 130 may prevent a breakdown phenomenon caused by punch-through between emitter 140 and collector 120 and may prohibit hole injection from first conductive type poly layer 124 to drift area 115. According to embodiments, a turn-off time may be reduced and a latch-up current may be increased. If a concentration of first buffer layer 130 is too high, a forward voltage drop may increase. According to embodiments, the first (segment) buffer layer 130 may have different concentrations according to areas, which may prevent a forward voltage drop. A hole current flow through first buffer layer 130 may be indicated by arrows in example FIG. 1. A thickness of the arrows may indicate an amount of the hole current. According to embodiments, first buffer layer 130 may not have a uniform concentration, but may have different concentrations depending on areas. Accordingly, hole currents h1, which may be injected into resistance (Rp) areas at bottoms of base areas 152, which may cause latch-up, may be reduced, and hole currents h1 injected into second ion implantation areas 164 (deep P+ area), which rarely affect latch-up, may be relatively increased.

According to embodiments, a level of a latch-up current may be increased by controlling hole currents to directly flow into emitter electrode 144 through second ion implantation area 164 without passing through resistance (Rp) areas, which may become a cause of latch-up. First conductive type poly layer 124 may be formed in a trench through which collector ion implantation area 122 may be selectively exposed, and second buffer layer 136 of the second conductive type may be formed next to the trench. According to embodiments, first conductive type poly layer 124 and second buffer layer 136 of the second conductive type may be formed between collector electrode 184 and collector ion implantation area 122. Accordingly, an entire hole current may be increased irrespective of a latch-up phenomenon. Since first segment buffer layer 130, which may be implemented to have different concentrations according to areas, and second buffer layer 136 may be adopted, amounts of hole currents injected through buffer layers 130 and 136 may differ according to areas. Accordingly, hole currents injected into resistance (Rp) areas of base areas 152, which may become latch-up, may be relatively decreased, so a latch-up current may be increased. Consequently, a forward voltage drop may be minimized and parasitic thyristor latch-up may be prevented.

A method of fabricating an IGBT according to embodiments is described below with reference to example FIGS. 2-8. Referring to example FIG. 2, collector ion implantation area 122 may be formed on and/or over substrate 110 by implanting ions of a first conductive type. According to embodiments, collector ion implantation area 122 may be formed within substrate 110 by injecting high-concentration P type ions. According to embodiments, drift area 115 may be formed on and/or over substrate 110. First segment buffer layers 132 may be formed on and/or over collector ion implantation area 122 by implanting ions of a second conductive type. For example, first segment buffer layers 132 may be formed by implanting low-concentration N type ions.

Figure 3:
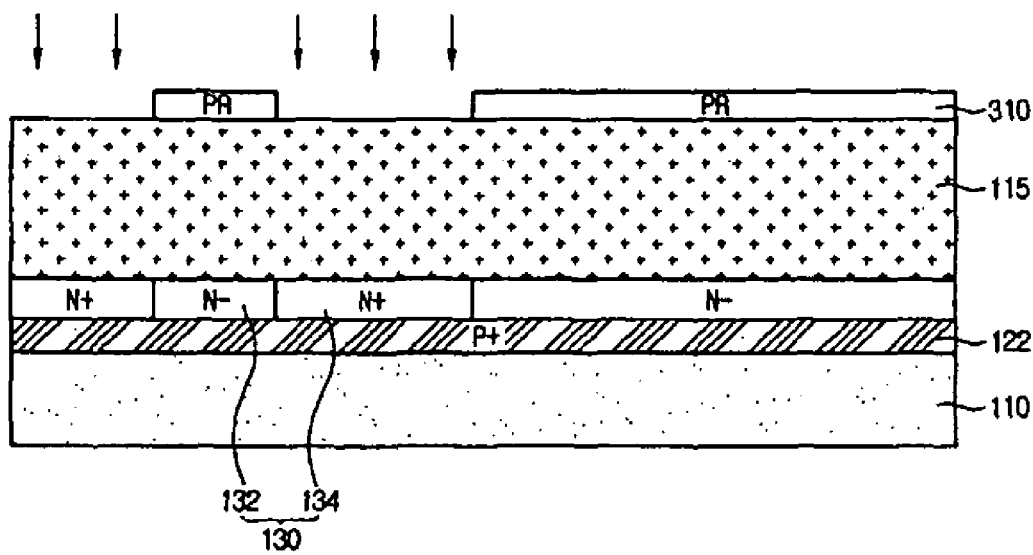

Referring to example FIG. 3, second segment buffer layers 134 may be formed using photoresist patterns 310 through which substrate 110 may be selectively exposed as a mask. According to embodiments, second segment buffer layers 134 may be formed next to first segment buffer layers 132 by implanting high-concentration N type ions. According to embodiments, photoresist patterns 310 may be patterned not to expose second ion implantation areas 164 that may be formed later. Since first segment buffer layer 130 of the second conductive type, which may have different concentrations according to areas, may be implemented, amounts of hole currents injected through first buffer layer 130 may differ according to areas.

Figure 4:
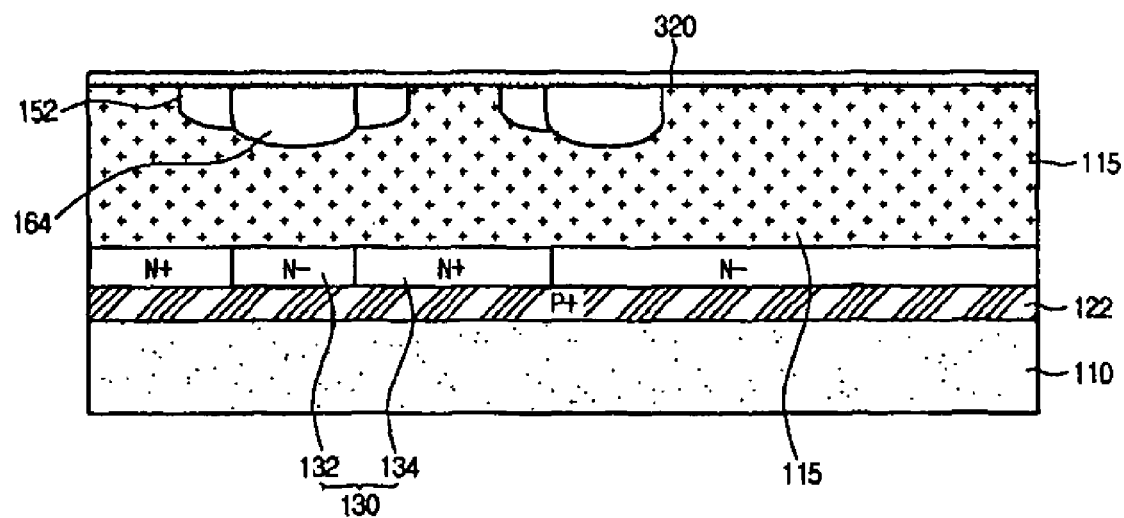

Referring to example FIG. 4, photoresist patterns 310 may be removed, and base areas 152 may be formed in first buffer layer 130 on and/or over substrate 110 by implanting ions of the first conductive type. According to embodiments, base areas 152 may be formed by implanting P type ions. Second ion implantation areas 164 may be formed under and/or below base areas 152 by implanting ions of the first conductive type. For example, second ion implantation areas 164, which may have a relatively high depth, may be formed by implanting high-concentration P type ions. According to embodiments, second ion implantation areas 164 of a high-concentration first conductive type may be under and/or below base areas 152. Accordingly, an amount of resistance Rp at bottoms of base areas 152 may be reduced, and a level of currents, which may generate latch-up, may be increased. Second ion implantation areas 164 may be formed at locations, and may each vertically correspond to first segment buffer layers 132. Base area 152 and second ion implantation area 164 may be formed through a patterning process of a photoresist film used as an ion implantation mask. Oxide layer 320 may then be formed on and/or over substrate 110.

Figure 5:
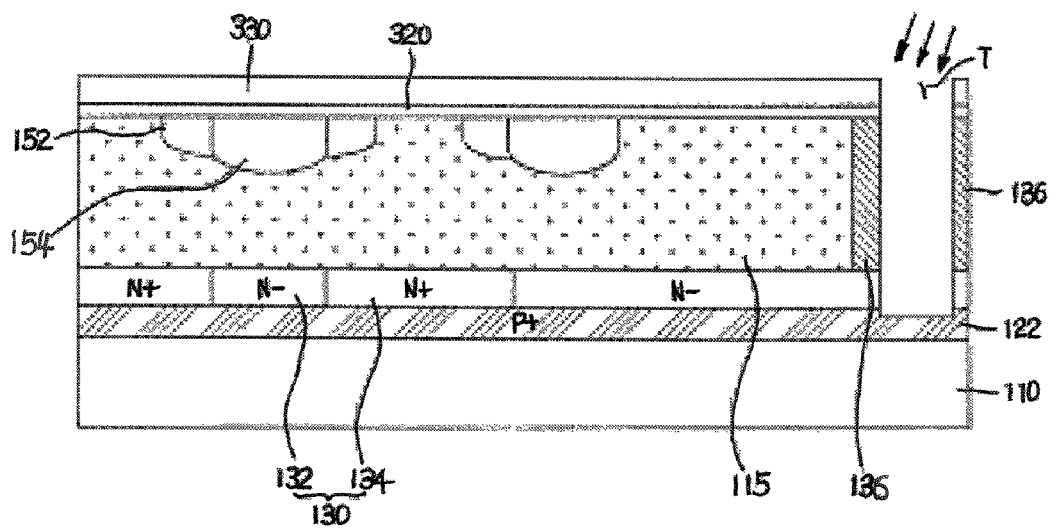

Referring to example FIG. 5, photoresist pattern 330, which may be used as an etch mask, may be formed. An etch process may be performed to thereby form trench T up to collector ion implantation area 122. According to embodiments, after trench T is formed, second buffer layer 136 may be formed by implanting ions of the second conductive type, and photoresist pattern 330 may then be removed. According to embodiments, a thermal treatment process may be carried out. A P+ polysilicon layer may be coated on and/or over oxide layer 320, and trench T may thereby be gap-filled. A polishing process, such as chemical mechanical polishing (CMP), may then be performed, and may remove the P+ polysilicon layer outside trench T.

Figure 6:
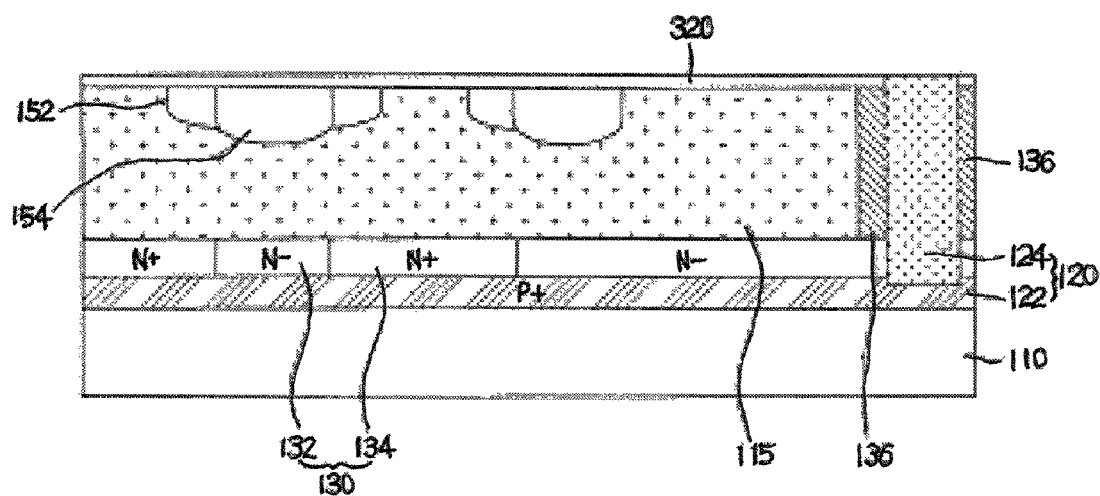

Referring to example FIG. 6, according to embodiments, first conductive type poly layer 124 may thus be formed. First conductive type poly layer 124 and collector ion implantation area 122 may function as collector 120.

Figure 7:
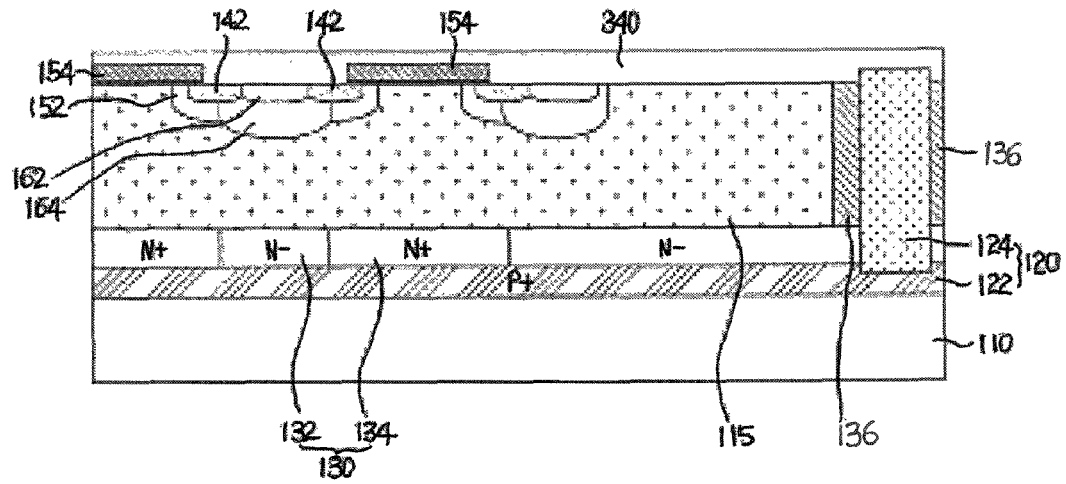

Referring to example FIG. 7, oxide layer 320 may be patterned, and gate poly may be stacked. This may form gates 154. The gate poly and patterned oxide layer 320, other than gate 154 area, may then be removed. Emitter ion implantation areas 142 may be formed within base areas 152 by implanting ions of the second conductive type. For example, emitter ion implantation areas 142 may be formed by implanting high-concentration N type ions. First ion implantation area 162 may then be formed within base area 152 on one side of emitter ion implantation area 142 by implanting ions of the first conductive type. According to embodiments, first ion implantation area 162 may be formed on and/or over second ion implantation area 164. For example, first ion implantation area 162 may be formed by implanting high-concentration P type ions. At least one of oxide film and nitride film 340 may then be formed on and/or over gate 154. At least one of oxide layer and nitride layer 340 may be selectively etched, which may form insulating layer 174 through which a top surface and active areas 142 and 162 of first conductive type poly layer 124 may be exposed.

Figure 8:
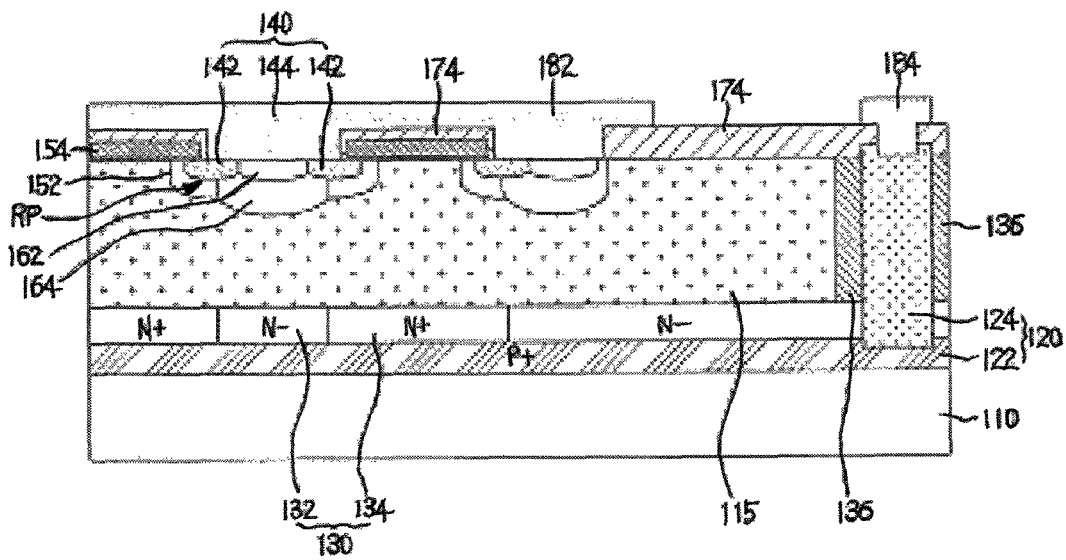

Referring to example FIG. 8, according to embodiments, a metal layer may be stacked and may gap-fill opened areas of insulating layer 174. It may then be patterned, which may form emitter electrode 144 electrically connected to emitter ion implantation areas 142 and collector electrode 184 electrically connected to first conductive type poly layer 124. A segment buffer layer may be implemented to have different concentrations according areas. Accordingly, amounts of hole currents injected through the buffer layers may differ according to areas. Hole currents injected into resistance (Rp) areas of the base areas, which may cause latch-up, may be relatively decreased. Hence, latch-up currents may be increased. Accordingly, a forward voltage drop may be minimized and parasitic thyristor latch up may be prevented.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising:
 a collector ion implantation area of a first conductive type, formed within a substrate;
 a first buffer layer of a second conductive type, formed over the collector ion implantation area, the first buffer layer including a first segment buffer layer and a second segment buffer layer;
 a first conductive type poly layer formed from a surface of the substrate to the collector ion implantation area, the first conductive type poly layer having a contact structure; and
 a second buffer layer of the second conductive type, formed in the substrate adjacent to the first conductive type poly layer.

2. The device of claim 1, wherein the first segment buffer layer has a different concentration of ion implantation than the second segment buffer layer.

3. The device of claim 1, further comprising:
 a base area of the first conductive type, formed over the first buffer layer;
 a gate formed over the substrate on one side of the base area; and
 an emitter ion implantation area of the second conductive type, formed within the base area.

4. The device of claim 3, further comprising:
 an insulating layer formed over the substrate to expose a portion the substrate between the gate and the first conductive type poly layer;
 an emitter electrode electrically connected to the emitter ion implantation area; and
 a collector electrode electrically connected to the first conductive type poly layer.

5. The device of claim 3, further comprising a first ion implantation area of the first conductive type, formed on one side of the emitter ion implantation area.

6. The device of claim 5, further comprising a second ion implantation area of the first conductive type, formed below the first ion implantation area and below at least a portion of the base area.

7. The device of claim 6, wherein the first buffer layer comprises:
 the first segment buffer layer formed at a location vertically corresponding to the second ion implantation area; and
 the second segment buffer layer formed adjacent to the first segment buffer layer.

8. The device of claim 7, wherein the first segment buffer layer has a concentration of ion implantation lower than that of the second segment buffer layer.

9. The device of claim 1, wherein the first conductive type comprises a P type and wherein the second conductive type comprises an N type.

\* \* \* \* \*